United States Patent
Kang et al.

(10) Patent No.: US 10,080,075 B2
(45) Date of Patent: Sep. 18, 2018

(54) PORTABLE SOUND EQUIPMENT

(71) Applicant: LG ELECTRONICS INC., Seoul (KR)

(72) Inventors: Obyoung Kang, Seoul (KR); Hyunsun Yoo, Seoul (KR); Youchang Kim, Seoul (KR); Jihye Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/387,478

(22) Filed: Dec. 21, 2016

(65) Prior Publication Data

US 2017/0311073 A1    Oct. 26, 2017

(30) Foreign Application Priority Data

Apr. 20, 2016  (KR) ......... 10-2016-0048208

(51) Int. Cl.
*H04R 29/00* (2006.01)
*H04R 1/10* (2006.01)
(Continued)

(52) U.S. Cl.
CPC ........ *H04R 1/1041* (2013.01); *G01R 33/02* (2013.01); *H04M 1/05* (2013.01); *H04M 1/6066* (2013.01);
(Continued)

(58) Field of Classification Search
CPC ........ H04R 2420/00; H04R 2420/01; H04R 2420/03; H04R 2420/07; H04R 2420/09;
(Continued)

(56) References Cited

U.S. PATENT DOCUMENTS 7,418,103 B2 *  8/2008  Sargaison ........... H04M 1/6058
                                                    381/370
8,744,113 B1 *  6/2014  Rickards ............... H04R 1/028
                                                    379/430
(Continued)

FOREIGN PATENT DOCUMENTS

| CN | 201674630 | 12/2010 |
| WO | 2006098584 | 9/2006 |
| WO | 2016032011 | 3/2016 |

OTHER PUBLICATIONS

European Patent Office Application Serial No. 16201958.2, Search Report dated Sep. 25, 2017, 6 pages.

*Primary Examiner* — Leshui Zhang
(74) *Attorney, Agent, or Firm* — Lee, Hong, Degerman, Kang & Waimey

(57) ABSTRACT

Disclosed is a portable sound equipment. The present invention includes a body, first and second holders formed at the body, and a pair of earbuds, each earbud of the pair of earbuds detachably coupled with the first and second holders. And each earbud of the pair of the earbuds comprises a sound output unit, a wireless communication unit, a detecting unit configured to detect whether the earbud is coupled with the first holder or the second holder, and a controller configured to control the wireless communication unit and the sound output unit in first mode in response to detection of coupling of the earbud with the first holder, and control the wireless communication unit and the sound output unit in a second mode in response to detection of coupling of the earbud with the second holder.

20 Claims, 8 Drawing Sheets

(51) Int. Cl.
 *G01R 33/02* (2006.01)
 *H04M 1/05* (2006.01)
 *H04M 1/60* (2006.01)
 *H04R 5/033* (2006.01)

(52) U.S. Cl.
 CPC ........... *H04R 1/105* (2013.01); *H04R 1/1016* (2013.01); *H04R 1/1025* (2013.01); *H04R 5/0335* (2013.01); *H04R 2420/07* (2013.01)

(58) Field of Classification Search
 CPC ............ H04R 2201/00; H04R 2201/02; H04R 2201/025; H04R 2201/10; H04R 2201/103; H04R 2201/105; H04R 2201/107; H04R 2201/109; H04R 2201/34; H04R 2201/40; H04R 2460/01; H04R 2460/05; H04R 2460/03; H04R 2460/07; H04R 2460/15; H04R 2460/17; H04R 1/00; H04R 1/025; H04R 1/026; H04R 1/345; H04R 1/403; H04R 1/10; H04R 1/1008; H04R 1/1058; H04R 1/1091; H04R 1/033; H04R 1/1016; H04R 1/1041; H04R 1/1083; H04R 1/105; H04R 1/1066; H04R 2201/401; H04R 2201/405; H04R 2205/022; H04R 2205/024; H04R 5/0335; H04R 5/033; H04R 5/02; H04R 2460/13; H04R 2499/11; H04R 2499/15
 USPC ......... 381/26, 91, 92, 72, 74, 119, 120, 122, 381/309, 311, 312–331, 58, 59, 60; 455/569.1, 563, 575.2, 575.6, 90.3; 379/428.01, 428.02
 See application file for complete search history.

(56) References Cited

U.S. PATENT DOCUMENTS

| | | | |
|---|---|---|---|
| 9,591,116 B2* | 3/2017 | Ekner | H04M 1/2473 |
| 2006/0029234 A1* | 2/2006 | Sargaison | H04M 1/6058 |
| | | | 381/74 |
| 2007/0092090 A1* | 4/2007 | Oddodart | H04B 1/3877 |
| | | | 381/111 |
| 2007/0098190 A1* | 5/2007 | Song | H03F 1/02 |
| | | | 381/120 |
| 2008/0020708 A1* | 1/2008 | Ku | H04M 1/0258 |
| | | | 455/41.2 |
| 2010/0020982 A1* | 1/2010 | Brown | H04R 1/1041 |
| | | | 381/74 |
| 2011/0286615 A1* | 11/2011 | Olodort | H04R 1/1025 |
| | | | 381/311 |
| 2012/0003937 A1 | 1/2012 | Zhong | |
| 2013/0244734 A1 | 9/2013 | Latham et al. | |
| 2014/0116085 A1 | 5/2014 | Lam | |
| 2014/0233752 A1* | 8/2014 | Seo | H04M 1/035 |
| | | | 381/74 |
| 2016/0227018 A1* | 8/2016 | Lee | H04M 1/72527 |
| 2016/0277827 A1* | 9/2016 | Woo | H04R 1/1041 |
| 2017/0094394 A1* | 3/2017 | McPeak | A45C 13/02 |

\* cited by examiner

PORTABLE SOUND EQUIPMENT

CROSS-REFERENCE TO RELATED APPLICATIONS

Pursuant to 35 U.S.C. § 119(a), this application claims the benefit of earlier filing date and right of priority to Korean Patent Application No. 10-2016-0048208, filed on Apr. 20, 2016, the contents of which are hereby incorporated by reference herein in its entirety.

BACKGROUND OF THE INVENTION

Field of the Invention

The present invention relates to a portable sound equipment. Although the present invention is suitable for a wide scope of applications, it is particularly suitable for receiving a sound signal from a terminal and transmitting a control signal for controlling the terminal through wireless communications with the terminal.

Discussion of the Related Art

Sound equipment means a sound device for receiving a sound signal from a terminal and transmitting sound information collected through a microphone to the terminal. According to the related art, a portable sound equipment has employed a wired mechanism for receiving a sound signal by inserting a terminal in an ear jack of a terminal. Yet, in aspects of mobility and use convenience, the demand for portable sound equipments of wireless communication type is increasing recently.

Various portable sound equipments configured to be portable on user's body (e.g., a headphone type in shape of a band fit to a head, an ear-hung type, an ear-fit type, etc.) are being developed in consideration of portability.

SUMMARY OF THE INVENTION

Accordingly, the present invention is directed to a portable sound equipment that substantially obviates one or more problems due to limitations and disadvantages of the related art.

One object of the present invention is to provide a portable sound equipment, which controls a right/left sound signal to be outputted in case of coupling a pair of earbuds with a right/left holder without division of right and left.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a portable sound equipment according to one embodiment of the present invention may include a body, first and second holders provided to the body, and earbud detachably coupled with the first and second holders by including sound output units, respectively, a pair of the earbuds including a wireless communication module, a detecting unit configured to detect whether the earbud attaches to the first holder or the second holder, and a controller configured to control the wireless communication unit and the sound output unit in first mode when the earbud attaches to the first holder, and control the wireless communication unit and the sound output unit in second mode when the earbud attaches to the second holder.

If the detecting unit detects a first identifier provided at the first holder, the controller may control the wireless communication unit and the sound output unit in second mode.

If the detecting unit detects a second identifier provided at the second holder or not detect the first identifier, the controller may control the wireless communication unit and the sound output unit in second mode.

The first identifier may include a first magnet having magnetic flux of first size. The detecting unit may include a hall sensor configured to detect the magnetic flux of the magnet. And, if the hall sensor senses the magnetic flux of the first size, the controller may switch to the first mode.

The second identifier may include a second magnet having magnetic flux of second size different from that of the first magnet. And, if the hall sensor senses the magnetic flux of the second size, the controller may switch to the second mode.

The first identifier may include an identifying terminal. The detecting unit may include a determining terminal coming into contact with the identifying terminal when the earbud is coupled with the first holder. And, if the determining terminal and the identifying terminal come into contact with each other, the controller may controls the earbud in the first mode.

The first identifier may include a first protrusion. The detecting unit may include a switch pressed by the first protrusion. And, if the switch enters ON state, the controller may switch to the first mode.

The portable sound equipment may further include power supply terminals located at the first and second holders, an auxiliary battery provided to the body and connected to the power supply terminal and a charging terminal provided to the earbud, the charging terminal configured to charge a main battery installed in the earbud by coming into contact with the power supply terminal.

If the charging terminal comes into contact with the power supply terminal, the controller may activate the detecting unit.

wherein the earbud comprise a first earbud and a second earbud, in case of the first mode, the wireless communication unit may receive a wireless signal from an external and transmit at least one portion of the received wireless signal to the wireless communication unit of the second earbud. And, in case of the second mode, the wireless communication unit may receive a wireless signal from the wireless communication unit of the second earbud.

In case of the first mode, the controller may control the sound output unit to output a left sound signal or a right sound signal. And, in case of the second mode, the controller may control the sound output unit to output a sound signal on a side opposite to that of the first mode.

The earbud may include a first earbud and a second earbud. And, if the first earbud is controlled in a first mode, the controller of the second earbud may control the second earbud in second mode.

The body may be configured wearable on user's body and the first holder and the second holder may be disposed on left and right sides of the user, respectively.

The body may include a band in C-shape configured to be hung on user's neck.

In another aspect of the present invention, a method of controlling a portable sound equipment including earbud coupled with a pair of holders provided to a body according to another embodiment of the present invention may include the steps of coupling the earbud with the one of holders, detecting a identifier provided at least one of the holders through a detecting unit of the earbud, if a first identifier is detected, driving the earbud in first mode, and if the first identifier is not detected or a second identifier provided at a second holder is detected, driving the earbud in second mode.

The identifier detecting step may include the steps of measuring magnetic flux, if the measured magnetic flux is equal to a first reference magnetic flux, driving the earbud in the first mode, and if the measured magnetic flux is equal to a second reference magnetic flux, driving the earbud in the second mode.

Each of the first mode driving step and the second mode driving step may include the step of saving the measured magnetic flux. And, the first identifier detecting step may include the steps of determining whether the measured magnetic flux matches a stored magnetic flux, if the measured magnetic flux matches the stored magnetic flux, maintaining a driving mode, and if the measured magnetic flux fails to match the stored magnetic flux, changing the driving mode into either the first mode or the second mode.

The method may further include the steps of in case of the first mode, transmitting at least one portion of a wireless signal received from an external terminal to the wireless communication unit of the other earbud and in case of the second mode, receiving a wireless signal from the wireless communication unit of the other earbud.

The method may further include the steps of in case of the first mode, controlling the sound output unit to output either a left sound signal or a right sound signal and in case of the second mode, controlling the sound output unit to output a sound signal on a side opposite to that of the first mode.

Accordingly, in a portable sound equipment according to the present invention, a user can always listen to a right sound and a left sound from a right side and a left side by switching right and left of a pair of wireless earbuds, respectively, whereby convenience of use can be enhanced.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
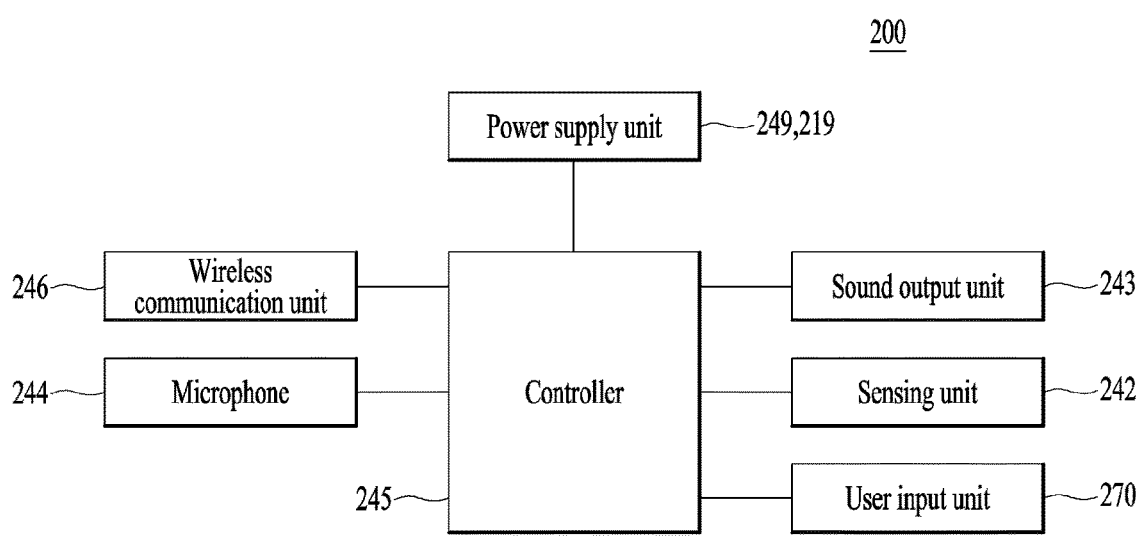
FIG. 1 is a block diagram to describe a portable sound equipment according to the present invention.

FIG. 1 is a block diagram of a portable sound equipment according to the present invention. A portable sound equipment 200 of the present invention may include a controller 245, a wireless communication unit 246, a sound output unit 243, a sensing unit 242, a microphone 244, a user input unit 270, and a power supply unit 219/249.

The sound output unit 243 is a device configured to output sound in accordance with sound signal and may be categorized into a speaker type for hearing sound in a spaced location according to an output or a type of an earbud 240 configured to deliver sound by being inserted in user's ear.

The microphone 244 processes external sound signal into electrical audio data. The processed audio data is delivered to an external terminal or server through the wireless communication unit 246. In order to eliminate noise generated in the course of receiving external sound signal, various noise elimination algorithms can be implemented in the microphone 244.

The sensing unit 242 is a device for recognizing a state of the portable sound equipment 200 and a surrounding situation, and may include an illumination sensor for sensing surrounding brightness, a touch sensor for sensing a touch input, a gyro sensor for sensing an inclination and position of the portable sound equipment, an earbud switch for detecting whether the earbud 240 is located at a holder 220, and the like.

As an input unit for a user to control the portable sound equipment 200, the user input unit 270 may include a call button, a button for sound level adjustment and the like, a power button, and the like.

The user input unit 270 may include only three buttons such as a call button and a pair of the sound level adjustment buttons, or may further include a play/stop button and a song order change button. Since a size of the portable sound equipment 200 is limited and a user frequently applies an input through the user input unit 270 without looking at the corresponding button, if the number of buttons increases, it is difficult to distinguish the functions of the respective button. Hence, it is able to expand control commands that can be inputted in a manner of combining a button pressed time, a button pressed count and a plurality of buttons using the limited number of buttons.

As the portable sound equipment 200 is normally worn on user's body, it is less probable that the portable sound equipment 200 is lost. On the contrary, when a general terminal is lost, it is able to find the lost terminal using alarm sound of the terminal connected through the wireless communication unit in a manner of pressing two user input units 270 (e.g., two buttons) at the same time for predetermined duration.

By activating a voice recording function of the terminal connected through the wireless communication unit, voice or audio collected through the microphone 244 of the portable sound equipment 200 can be saved to the terminal.

According to the related art, only a call related function or a sound media play related function has been controllable through a portable sound equipment. Yet, the portable sound equipment according to the present invention is characterized in expanding the control range of its own.

Figure 2:
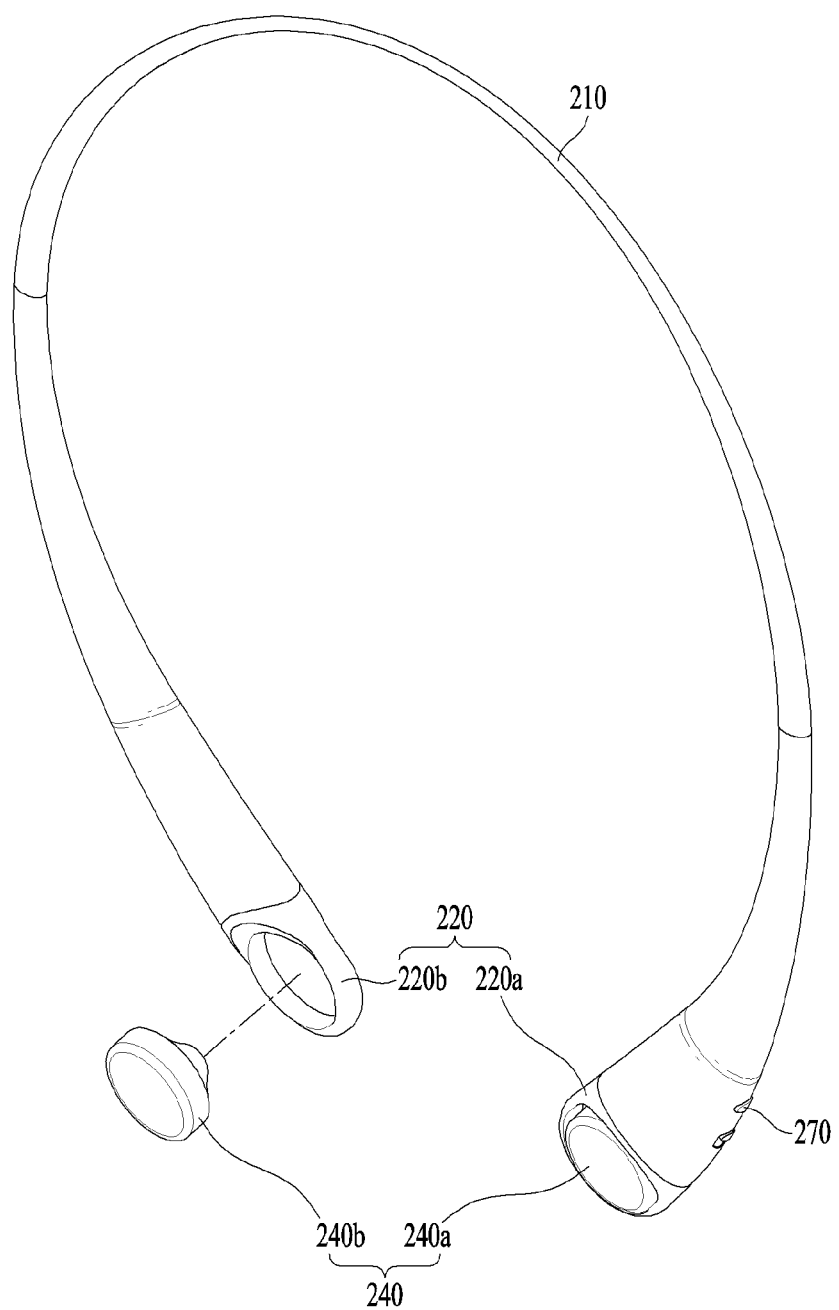
FIG. 2 is a perspective diagram of a portable sound equipment according to one embodiment of the present invention, viewed in one direction.
Figure 3:
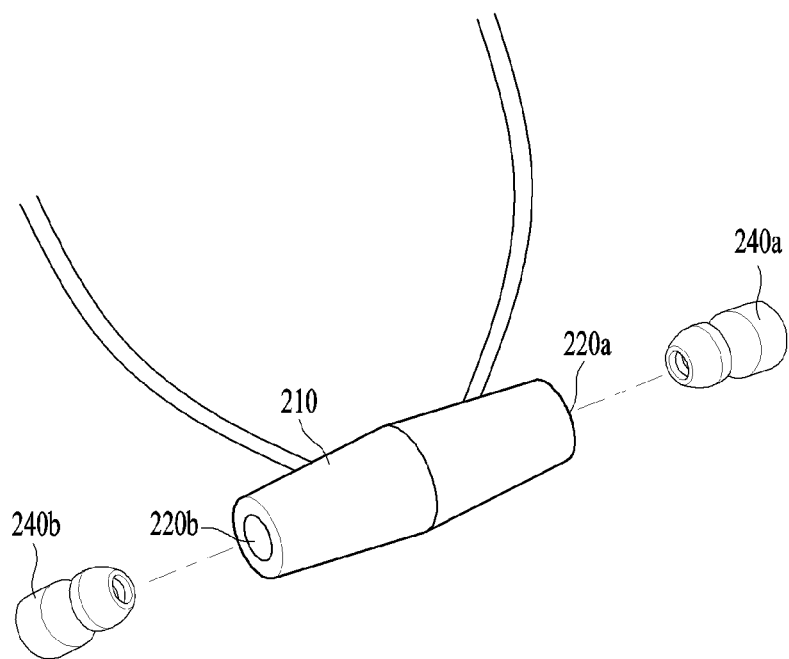
FIG. 3 is a perspective diagram of a portable sound equipment according to another embodiment of the present invention, viewed in one direction.

FIG. 2 is a perspective diagram of a portable sound equipment 200 according to one embodiment of the present invention, viewed in one direction. FIG. 3 is a perspective diagram of a portable sound equipment 200 according to another embodiment of the present invention.

According to the embodiment shown in FIG. 2, since a body 210 is bent in C-shape, it can be worn in a manner of being hung on user's neck. According to the embodiment shown in FIG. 3, the body 210 can be used in a manner of being worn on user's neck like a necklace.

The portable sound equipment 200 includes the body 210 of a type wearable on user's body as well as the type shown in FIG. 2 or FIG. 3. Such a type wearable on user's body may include a belt attached type, a jacket pocket stuck type, a necktie pin type, or the like. The body 210 of the present invention may have a bar or circle shape for convenient portability as well as a wearable type coupled with user's body, clothes, or the like. For instance, the body 210 may have a simple shape without a chain or strap in comparison with the type shown in FIG. 3.

A pair of earbuds 240 having the sound output unit 243 for outputting sound according to sound information by being inserted in user's ears are included. A pair of the earbuds 240 are coupled with holders 220 provided to right and left sides of the body 210. Hence, while a pair of the earbuds 240 are not in use, they can be carried together with the body 210.

Since a user has a pair of ears, a pair of the earbuds 240 exist. A pair of the earbuds 240 are inserted in user's right and left ears to deliver sound information. Particularly, a pair of the earbuds 240 of the present invention are separated from the body 210 instead of being connected to the body 210 through wires and can be used by receiving sound signals by wireless. Hence, the inconvenience of the wired earphone or headset of the related art can be overcome.

The holder 220 can be formed in different shape at different location according to a shape of the earbud 240 or the body 210.

Figure 4:
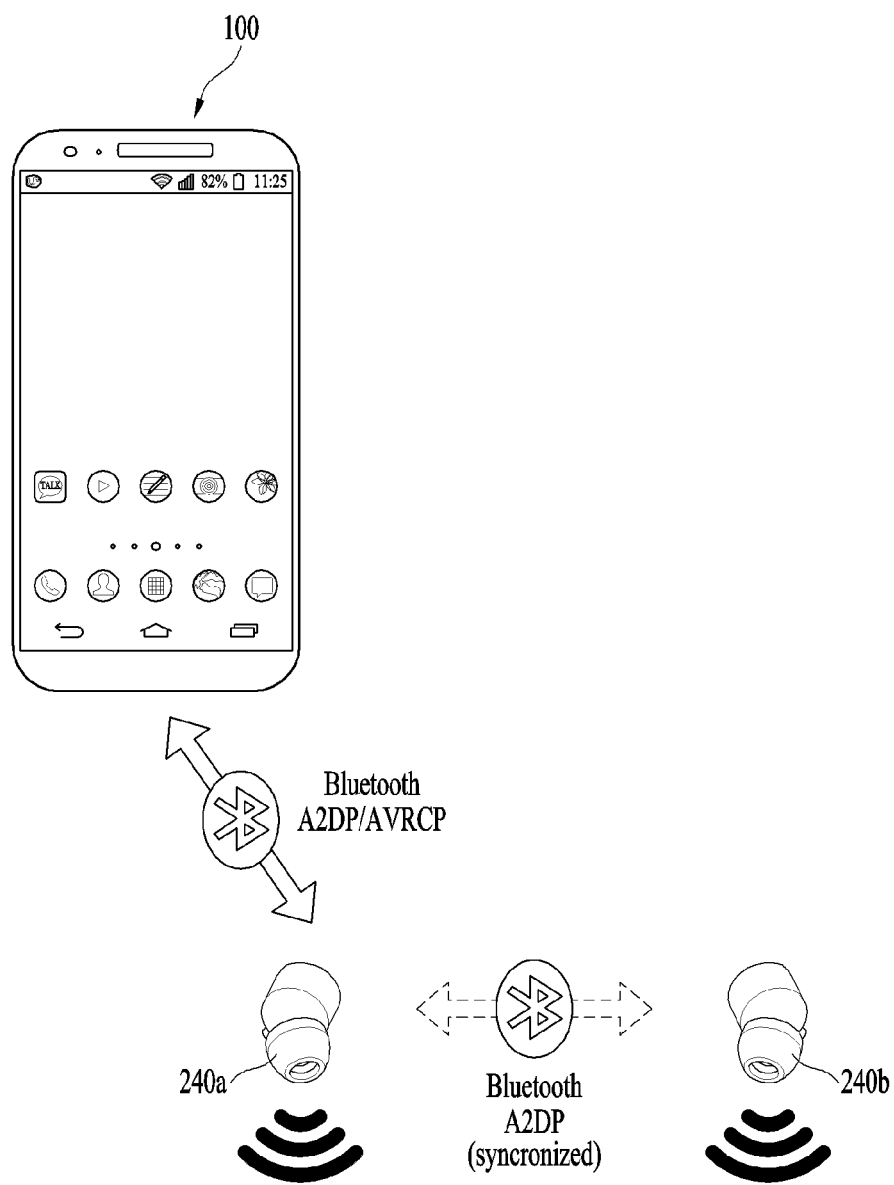
FIG. 4 is a diagram to describe the wireless communication concept of a portable sound equipment according to one embodiment of the present invention.

Since a pair of the earbuds 240 are not connected through wires, each of the earbuds 240 has the wireless communication unit 246 and is able to deliver a sound or call signal received from an external terminal 100 shown in FIG. 4 or a server through the wireless communication unit 246 to a user. Although a pair of the earbuds 240 can produce the same sound, they can output different sounds according to different right and left sound signals for vivid sounds.

FIG. 4 is a diagram to describe the wireless communication concept of the portable sound equipment 200 according to one embodiment of the present invention.

In order to provide stereo sound (2-channel) for outputting sound according to different right and left sound signals, it is able to use TWS (true wireless stereo) technology of outputting sound by separating an audio source inputted from an external terminal into two channels (i.e., right and left channels).

One earbud 240a plays a main role (or a master role) and the other earbud 240b plays a sub role (or a slave role). An audio source is transmitted to the main earbud 240 and then transmitted to the synchronized sub earbud 240b from the wireless communication unit 246 of the main earbud 240a. In this process, 2 channels are separated to provide stereo sound.

In doing so, a communication scheme may employ A2DP (advanced audio distribution profile) scheme or AVRCP (audio/video remote control profile) scheme.

A2DP is a sort of a profile for determining a state of sound quality in delivering sound by Bluetooth. A2DP is designed to deliver unidirectional 2-channel stereo sound and enables MP3 player or smartphone to play music through Bluetooth headset or earphones. Unlike HSP or HFP used for phone call, the A2DP technology provides high stereo sound quality. The A2DP is a profile advanced by one more step than AVRCP, which is the first profile providing the conventional stereo sound quality, and provides the best function in appreciating music. Moreover, since there is no delay in sound delivery between a pair of the earbuds 240, there is no problem of mismatch of sounds provided from both sides.

Since there is the need for quality improvement of the portable sound equipment 200, although a convenience-enhanced wireless scheme is employed, it is able to provide sound of good quality competitive with a wired scheme.

AVRCP scheme is the communication scheme designed to provide a standard interface configured to control other devices capable of controlling TV, Hi-Fi equipments, or all A/V equipments accessible by a user using a single remote control (or other device). In particular, the AVRCP scheme is the technology for controlling such functions as volume adjustment, play, stop, skip, timer and the like and is characterized in that the main earbud 240a and an external terminal transceive the corresponding commands to control the corresponding functions, respectively.

Only A2DP scheme is used between the main earbud 240a and the sub ear bud 240b. The main earbud 240a performs a basic control. The sub earbud 240b receives one-side sound separated by the main earbud 240a only and outputs the received sound. Hence, it is unnecessary to transceive a control signal between a pair of the earbuds 240.

The main earbud 240a provides left sound and the sub earbud 240b provides right sound. On the contrary, the main earbud 240a provides right sound and the sub earbud 240b provides left sound.

Thus, as the direction of the sound outputted from the main earbud 240a and the direction of the sound outputted from the sub earbud 240b are fixed, if the earbuds are worn in a manner of switching right and left, it causes a problem that the earbuds provide opposite sounds. If a user wears the earbuds without recognizing the switched directions, the user is unable to appreciate the stereo sound correctly, whereby sound even worse than mono sound may be provided.

In order to solve the above problems, the present invention provides the portable sound equipment 200 capable of switching main and sub to each other. In case that the main earbud 240a and the sub earbud 240b provide left sound and right sound, respectively, the portable sound equipment 200 according to the present invention can change a drive mode of the earbud 240 so that the earbud 240 worn on user's left ear can become main.

Figure 5:
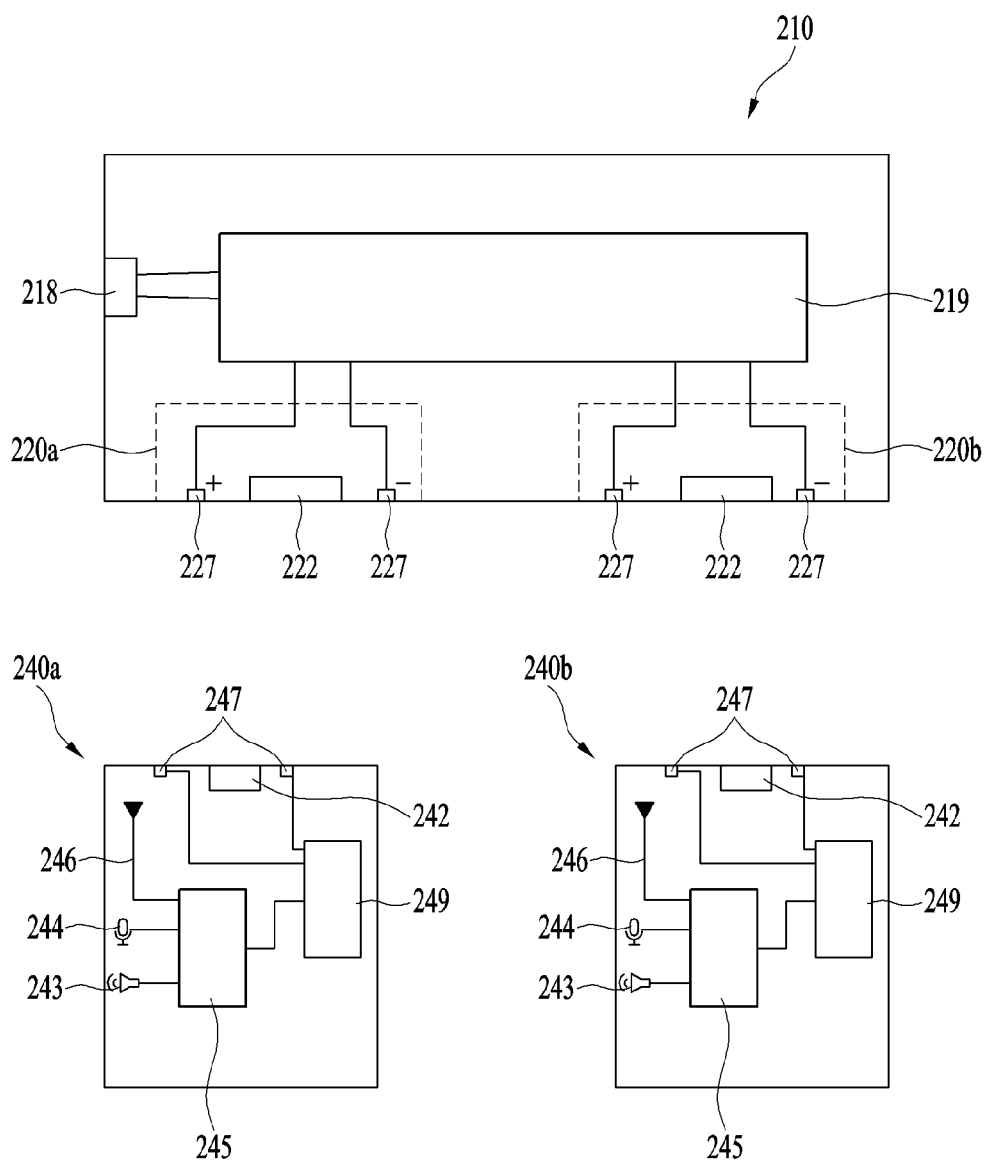
FIG. 5 is a block diagram for configuration of a portable sound equipment according to one embodiment of the present invention.

FIG. 5 is a block diagram for configuration of the portable sound equipment 200 according to one embodiment of the present invention.

A body 210 of the present invention includes an auxiliary battery 219. Each of a pair of earbuds 240 includes a sound output unit 243, a main battery 249 and a microphone 244. Optionally, the microphones 244 may be provided to both sides, respectively or the microphone 244 may be provided to the earbud 240 on one side only. A controller 245 configured to control the wireless communication unit 246, the microphone 244, the sound output unit 243 of the earbud 240 and the like is included. Since the earbud 240 has a small size enough to avoid heaviness on being worn, duration time of the main battery 249 is short. Hence, when the earbud 240 is coupled with the holder 220, the main battery 249 can be charged with the power of the auxiliary battery 219.

The holder 220 includes a power supply terminal 227 connected to the auxiliary battery 219 provided to the body 210. A charging terminal 247 of the earbud 240 is situated at a location where the charging terminal 247 comes into contact with the power supply terminal 227 on coupling the earbud 240 with the holder 220.

The holder 220 provided to the body 210 may have a locking structure or mechanism (e.g., magnet, hook, etc.) for fixing the earbud 240 thereto.

Since the earbud 240 of the present invention communicates by wireless, as shown in FIG. 4, the earbud 240 is equipped with the wireless communication unit 246 of its own. The wireless communication unit 246 performs short range wireless communication and can perform it by Bluetooth representatively. The wireless communication unit 246 can perform both A2DP wireless communication and AVRCP wireless communication.

The body 210 of the present invention is mounted on user's body. When the body 210 is mounted on user's body, the holder 220 is disposed on right and left sides. Hence, a user uses the earbud 240a located at the left holder 220a by inserting it in a left ear and also uses the earbud 240b located at the right holder 220b by inserting it in a right ear.

In consideration of such habit, the portable sound equipment 200 according to the present invention controls left sound to be outputted from the earbud 240a coupled with the holder 220a located on the left side of the body 210 and is also able to control right sound to be outputted from the earbud 240b coupled with the holder 220b located on the right side of the body 210.

According to the description of the present embodiment, the earbud 240a for outputting the left sound and the earbud 240b outputting the right sound are assumed as the main earbud and the sub earbud, respectively. Moreover, the present invention includes the case that the earbud for outputting the right sound and the earbud for outputting the left sound correspond to the main earbud and the sub earbud, respectively.

Each of a pair of the holders 220 includes an identifier 222 configured to identify whether the earbud 240 is coupled with the left holder 220a or the right holder 220b. If the identifier 222 is sensed, the earbud 240 can be set for a first mode. If the identifier 222 is not sensed, the earbud 240 can be set for a second mode. Alternatively, identifiers 222 may be provided to the left side and the right side, respectively and are characterized in being different from each other. In particular, if a first identifier 222a is sensed, the earbud 240 can be driven in the first mode. If a second identifier 222b is sensed, the earbud 240 can be driven in the second mode.

In the following description, the first mode means that the earbud 240 is driven as the main earbud 240a. And, the second mode means that the earbud 240 is driven as the sub earbud 240b. Moreover, the present invention includes a case that the first mode and the second mode correspond to the sub earbud 240b and the main earbud 240a, respectively.

According to the present embodiment, a magnet 222 plays a role as the identifier 222 and a hall sensor 242 provided to the earbud 240 plays a role as the sensing unit 242. Since the magnets 222 provided to the respective holders 220 differ from each other in strength, if the hall sensor 242 provided to the earbud 240 senses the strength of the magnet 222, the controller 245 provided to the earbud 240 determines whether the coupled holder 220 is a left holder 220a or a right holder 220b.

For instance, when the left holder 220a and the right holder 220b are provided with the magnet 222 of 500 Gauss and the magnet of 1,000 Gauss, respectively, if the hall sensor 242 provided to the earbud 240 senses the magnetism of 500 Gauss, it determines that the earbud 240 is coupled with the left holder 220a and then changes the setting into the main earbud 240a. In particular, the earbud 240 coupled with the left holder 220a receives 2-channel audio signal through direct wireless communication with an external terminal, the controller 245 separates sounds of 2 channels, the controller 245 outputs left sound to the main earbud 240a, and the controller 245 transmits right sound to the other earbud 240.

In doing so, if the earbud 240 on the other side receives the audio signal transmitted from the main earbud 240a, it can be automatically switched to the sub earbud 240b.

Figure 6:
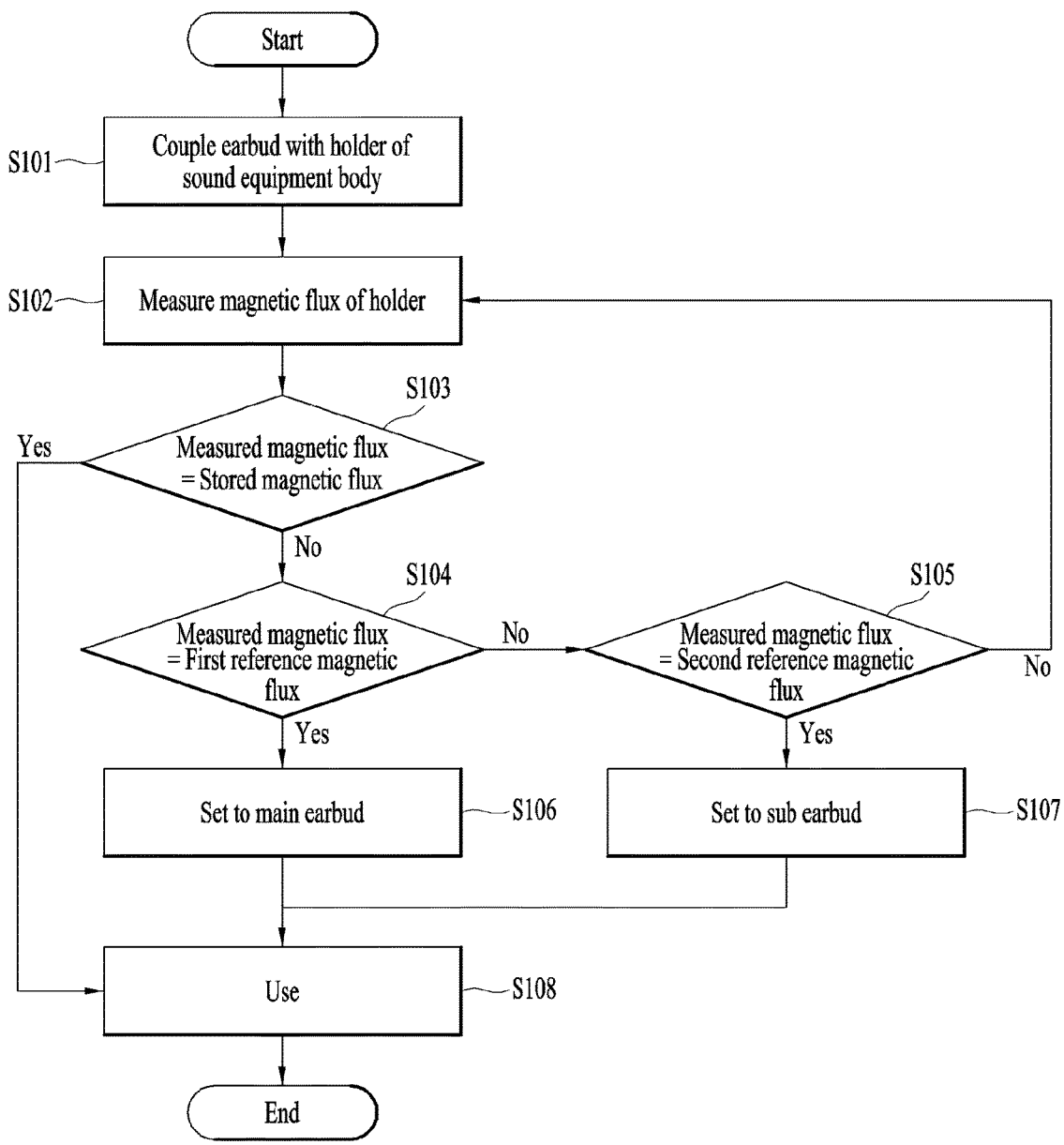
FIG. 6 is a flowchart for operation of the portable sound equipment shown in FIG. 5.

FIG. 6 is a flowchart for operation of the portable sound equipment 200 shown in FIG. 5. If the earbud 240 is coupled with the holder 220 of the sound equipment body 210

[S101], the hall sensor 242 of the earbud 240 measures magnetic flux of the holder 220 (i.e., senses the identifier 222) [S102].

If the measured magnetic flux is equal to the stored magnetic flux, the settings are maintained intact [S103]. If the measured magnetic flux is not equal to the stored magnetic flux, the settings can be changed. For instance, when the left holder 220a and the right holder 220b are provided with the magnet 222 of 500 Gauss and the magnet 222 of 1,000 Gauss, respectively, in case that the first earbud 240a is set as the main earbud 240a, if the first earbud 240a senses the magnetism of 1,000 Gauss, the sensed magnetism is different from the stored magnetic flux. Hence, it is able to change the settings.

If it is sensed that the measured magnetic flux is a first reference magnetic flux (i.e., the strength of the magnet 222 of the left holder 220a), the main earbud 240a is set [S104, S106]. If it is sensed that the measured magnetic flux is a second reference magnetic flux (i.e., the strength of the magnet 222 of the right holder 220b), the sub earbud 240b is set [S105, S107]. Each of the first and second reference magnetic fluxes may have a value in a prescribed range instead of having a specific value.

It may be unnecessary to compare the measured magnetic flux with the first or second reference magnetic flux. Instead, it is determined whether the measured magnetic flux is equal to the stored magnetic flux. If the compared magnetic fluxes are different, the main can be changed into the sub, and vice versa. In particular, the steps S104 to S107 can be skipped.

Alternatively, when the earbud 240 is set, magnetic flux is not saved but the step S104 can be skipped. In particular, each time the earbud 240 is coupled with the holder 220, the earbud 240 can be set to main or sub based on the magnetic flux value measured by the sensing unit 242. If the first earbud 240a is coupled with the left holder 220a only but the second earbud 240b is not coupled with the right holder 220b, the sensing unit 242 of the first earbud 240a senses the identifier 222 of the left holder 220a and then sets the earbud 240 to the main. In doing so, by sending the setting state of the first earbud 240a to the second earbud 240b failing to be coupled with the holder 220, the second earbud 240 can be set to the sub earbud.

On the contrary, in case that the earbud 240 is coupled with the right holder 220b only, the earbud 240 coupled with the right holder 220b and the earbud 240 failing to be coupled with the holder 220 can be set to the sub earbud and the main earbud, respectively.

With reference to FIG. 5 and FIG. 6, the embodiments for the identifier 222 to guide the earbud 240 to be fixed to or coupled with the holder 220 using the scheme of differentiating the strength of the magnet are described. Another embodiment of the identifier 222 is described as follows.

Figure 7:
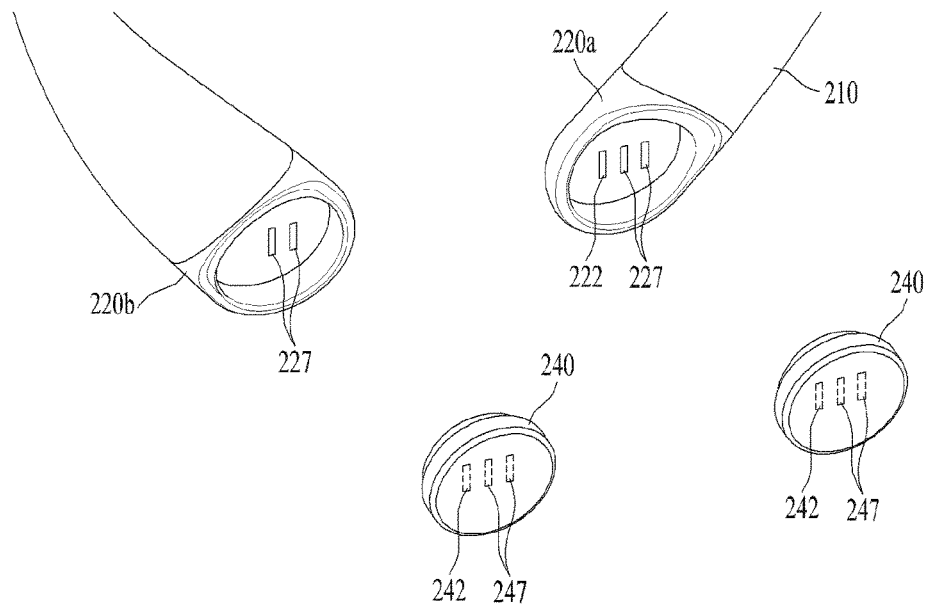
FIGS. 7 to 9 are diagrams to describe a manner of coupling an earbud with a holder in a portable sound equipment according to another embodiment of the present invention.
Figure 8:
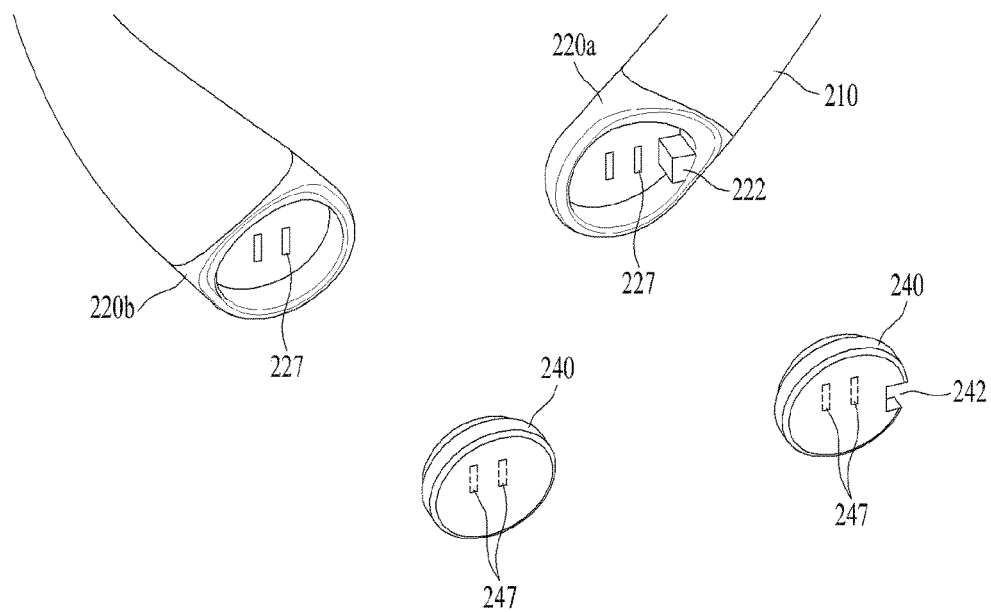
Figure 9:
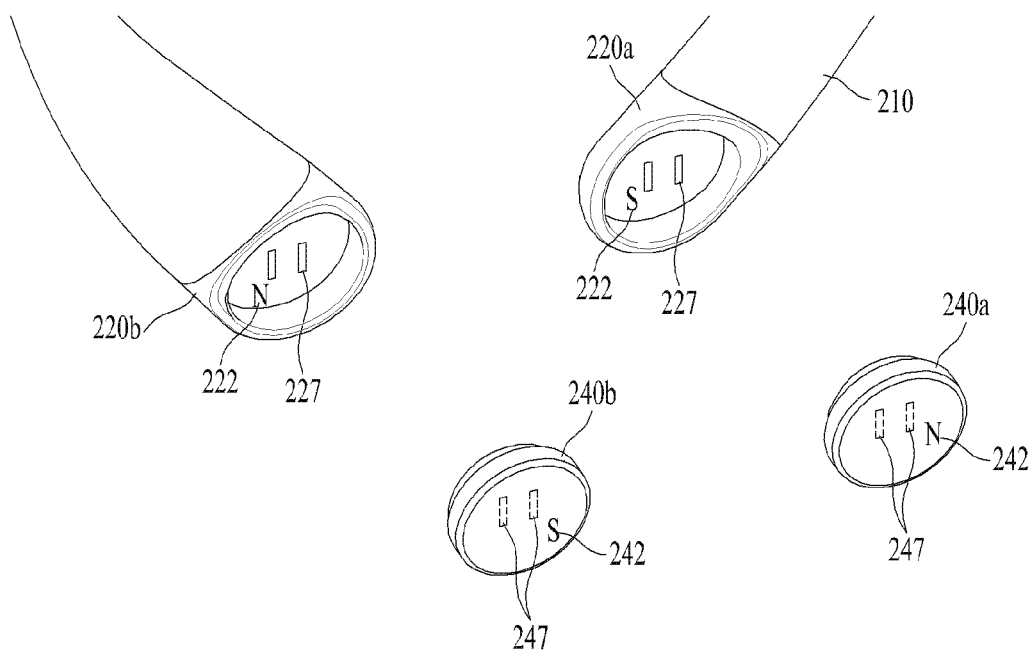

FIGS. 7 to 9 are diagrams to describe a manner of coupling the earbud 240 with the holder 220 in the portable sound equipment 200 according to another embodiment of the present invention.

FIG. 7 is characterized in that the identifier 222 is a terminal. For the charging from the auxiliary battery 219, a charging terminal 247 and a power supply terminal 227 are provided to the earbud 240 and the holder 220, respectively. An identifying terminal 222 is further provided to the holder 200 on one side and a determining terminal 242 for sensing the identifying terminal 222 is provided to the earbud 240. In particular, the identifying terminal 222 plays a role as the identifier and the determining terminal 242 plays a role as the sensing unit 242.

In case that the identifying terminal 222 is located at the left holder 220a, the identifying terminal 222 enables specific current to flow. If the determining terminal 242 senses the current, the corresponding earbud 240 is set to the main earbud 240a, left sound is outputted, and right sound is transmitted to the sub earbud 240b. While the charging terminal 247 comes into contact with the power supply terminal 227, if the determining terminal 242 of the earbud 240 fails to sense the identifying terminal 222, the earbud 240 is set to the sub earbud 240b and the right sound transmitted from the main earbud 240a is received and outputted.

The embodiment shown in FIG. 8 is characterized in that the identifier 222 is a first protrusion 222 protruding from the holder 220. A switch (not shown in the drawing) inserted to correspond to the first protrusion 222 is the sensing unit 242. If the switch is pressed by the first protrusion 222, the main earbud 240a is set. If not sensed, the sub earbud 240b is set.

Alternatively, a second protrusion 242 corresponding to the first protrusion 222 is formed on the earbud 240 on one side. And, the earbud 240 having the second protrusion 242 formed thereon is physically allowed to be coupled with the holder 220 having the first protrusion. Hence, it is able to guide a user to couple the earbud 240 set to the left/right (main/sub) earbud 240 with the left/right holder 220b only.

In FIG. 9, right and left polar of the magnet 222 provided to the holder 220 are differentiated and right and left polar of the magnets 242 provided to the earbuds 240a and 240b are differentiated. Hence, only the earbud 240b having the S-polar magnet 242 can be coupled with the holder 220b having the N-polar magnet 222. And, only the earbud 240a having the N-polar magnet 242 can be coupled with the holder 220a having the S-polar magnet 222.

No matter whether the holder 220 is coupled with the body 210, if the earbud 240 is provided with a gyro sensor of its own, it is able to sense a direction of the earbud 240 using the gyro sensor. When the earbud 240 is inserted in user's left ear, since the sound output hole of the earbud 240 is disposed in a right direction, the earbud 240 becomes the main earbud 240 outputting left sound. If the sound output hole of the earbud 240 is disposed in a left direction, it is determined that the earbud 240 is worn on right ear. Hence, the earbud 240 can be set to the sub earbud 240 outputting right sound. (If the earbud 240 outputting the right sound is the main earbud 240, the setting can be reversed.)

In doing so, while the earbud is not worn by a user, right and left directions can be switched to each other. If one direction is maintained over prescribed time, the setting can be changed. Alternatively, only if the user wears the earbud 240, the setting is changed to determine whether the user wears the earbud 240. Hence, if a temperature or proximity sensor is provided to the earbud 240, it is able to determine whether the user wears the earbud 240 using the provided sensor.

If the temperature sensor senses a temperature within a range of human body temperature, the setting is changed. If the proximity sensor senses a proximate object not from an opposite side but around the sound output hole or an illumination sensor senses that illumination intensity around the sound output hole is smaller than that on the opposite side, it is able to determine that a user wears the earbud 240.

In case that the earbud 240 is coupled with the holder 220, the electrode of the charging terminal 247 comes into contact with the electrode of power supply terminal 227. Hence, it is able to distinguish a case of being coupled with the holder 220 from a case of being worn by a user.

As mentioned in the above description, since the portable sound equipment according to the present invention switches positions (right and left) of a pair of the wireless earbuds 240 to each other, a user can always listen to left sound and right sound from left side and right side, respectively. Hence, convenience of use can be enhanced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A portable sound equipment, comprising:
a body;
a first holder and a second holder formed at the body; and
a pair of earbuds, each earbud of the pair of earbuds detachably coupled with a corresponding one of the first and second holders,
wherein each earbud of the pair of the earbuds comprises:
a sound output unit;
a wireless communication unit;
a sensor; and
a controller operably coupled to the sound output unit, the wireless communication unit, and the sensor, and configured to:
detect whether the earbud is coupled with the first holder or the second holder via the sensor;
control the wireless communication unit and the sound output unit in a first mode in response to detection of coupling of the earbud with the first holder; and
control the wireless communication unit and the sound output unit in a second mode in response to detection of coupling of the earbud with the second holder.

2. The portable sound equipment of claim 1, wherein the controller is further configured to control the wireless communication unit and the sound output unit in the first mode in response to detection, by the detecting unit, of a first identifier located at the first holder.

3. The portable sound equipment of claim 2, wherein the controller is further configured to control the wireless communication unit and the sound output unit in the second mode in response to detection, by the detecting unit, of a second identifier located at the second holder or when the first identifier is not detected by the detecting unit.

4. The portable sound equipment of claim 3, wherein:
the first identifier comprises a first magnet having magnetic flux of a first value;
the detecting unit comprises a sensor configured to detect magnetic flux of a magnet; and
the controller is further configured to switch to the first mode in response to detection of the magnetic flux of the first value by the sensor.

5. The portable sound equipment of claim 4, wherein:
the second identifier comprises a second magnet having magnetic flux of a second value that is different from the first value; and
the controller is further configured to switch to the second mode in response to detection of the magnetic flux of the second value by the sensor.

6. The portable sound equipment of claim 2, wherein:
the first identifier comprises an identifying terminal;
the detecting unit comprises a determining terminal configured to be in contact with the identifying terminal when the earbud is coupled with the first holder; and
the controller is further configured to control the earbud in the first mode when the determining terminal and the identifying terminal are in contact with each other.

7. The portable sound equipment of claim 2, wherein:
the first identifier comprises a first protrusion;
the detecting unit comprises a switch configured to be pressed by the first protrusion when the earbud is coupled with the first holder; and
the controller is further configured to switch to the first mode when the switch enters an ON state by being pressed by the first protrusion.

8. The portable sound equipment of claim 1, further comprising:
a power supply terminal located at each of the first and second holders and coupled to an auxiliary battery located at the body; and
a charging terminal located at each earbud of the pair of earbuds and configured to charge a main battery located at a corresponding earbud of the pair of earbuds when the charging terminal is in contact with the power supply terminal.

9. The portable sound equipment of claim 8, wherein the controller is further configured to activate the detecting unit when the charging terminal comes into contact with the power supply terminal.

10. The portable sound equipment of claim 1, wherein:
the wireless communication unit comprises a first wireless communication unit located at one earbud of the pair of earbuds and a second wireless communication unit located at the other earbud of the pair of earbuds; and
the controller is further configured to:
cause the first wireless communication unit to receive a wireless signal from an external terminal and to transmit at least one portion of the received wireless signal to the second wireless communication unit in the first mode; and
cause the first wireless communication unit to receive a wireless signal from the second wireless communication unit in the second mode.

11. The portable sound equipment of claim 1, wherein:
the controller is further configured to cause the sound output unit to output one of a left sound signal and a right sound signal in the first mode; and
the controller is further configured to cause the sound output unit to output the other one of the left sound signal and the right sound signal in the second mode.

12. The portable sound equipment of claim 1, wherein:
the pair of earbuds comprises a first earbud and a second earbud; and
the controller of the second earbud is further configured to control the second earbud in the second mode when the first earbud is controlled in the first mode.

13. The portable sound equipment of claim 12, wherein:
the first earbud is driven as a main earbud and the second earbud is driven as a sub earbud when the first earbud is controlled in the first mode and when the second earbud is controlled in the second mode; and
an audio source is received by the first earbud and then transmitted to the second earbud from the wireless communication unit of the first earbud, the second earbud synchronized with the first earbud, such that one of a left sound signal and a right sound signal is output via a first sound output unit of the first earbud and the other one of the left sound signal and the right sound signal is output via a second sound output unit of the second earbud.

14. The portable sound equipment of claim 1, wherein:
the body is shaped to be wearable on a user's neck; and
the first holder is located near a left side of the user's neck and the second holder is located near a right side of the user's neck when the body is worn on the user's neck.

15. The portable sound equipment of claim 14, wherein the body comprises a band in a C-shape or U-shape and configured to be worn around the user's neck.

16. A method for controlling a portable sound equipment, wherein the portable sound equipment comprises a body having a first holder and a second holder and a pair of earbuds, and wherein each earbud of the pair of earbuds is detachably coupled with a corresponding one of the first and second holders and comprises a controller operably coupled with a sound output unit outputting sound; a wireless communication unit receiving and transmitting wireless signals through short range wireless communication; and a sensor, the method performed by the controller and comprising:
detecting whether the earbud is coupled with the first holder or the second holder via the sensor;
controlling the wireless communication unit and the sound output unit in a first mode in response to detection of coupling of the earbud with the first holder; and
controlling the wireless communication unit and the sound output unit in a second mode in response to detection of coupling of the earbud with the second holder.

17. The method of claim 16, further comprising:
measuring magnetic flux of the earbud coupled with the first or second holder, the measured magnetic flux being different based on whether the earbud is coupled with the first holder or with the second holder;
driving the coupled earbud in the first mode when the measured magnetic flux is equal to a first reference magnetic flux; and
driving the coupled earbud in the second mode when the measured magnetic flux is equal to a second reference magnetic flux.

18. The method of claim 17, wherein:
controlling the wireless communication unit and the sound output unit in the first or second mode comprises storing the measured magnetic flux; and
the method further comprises:
detecting a first identifier located at the first holder by determining whether the measured magnetic flux matches the stored magnetic flux;
maintaining a current driving mode when the measured magnetic flux matches the stored magnetic flux; and
changing the current driving mode to the first mode or the second mode based on whether the current driving mode is the first mode or the second mode when the measured magnetic flux fails to match the stored magnetic flux.

19. The method of claim 16, further comprising:
transmitting, by a first wireless communication unit of one earbud of the pair of earbuds, at least one portion of a wireless signal received from an external terminal to a second wireless communication unit of the other earbud of the pair of earbuds in the first mode; and
receiving, by the first wireless communication unit, a wireless signal from the second wireless communication unit in the second mode.

20. The method of claim 16, further comprising:
outputting one of a left sound signal and a right sound signal via the sound output unit in the first mode; and
outputting the other one of the left sound signal and the right sound signal via the sound output unit in the second mode.

* * * * *